(12) United States Patent
Eriksson (10) Patent No.: US 12,164,006 B2
(45) Date of Patent: Dec. 10, 2024

(54) MEASURING DEVICE AND METHOD FOR DETERMINING AN ELECTRICAL PROPERTY

(71) Applicant: BATIXT IP AB, Karlsborg (SE)

(72) Inventor: Lars Eriksson, Linköping (SE)

(73) Assignee: BATIXT IP AB, Karlsborg (SE)

( * ) Notice: Subject to any disclaimer, the term of this patent is extended or adjusted under 35 U.S.C. 154(b) by 34 days.

(21) Appl. No.: 17/907,257

(22) PCT Filed: Mar. 23, 2021

(86) PCT No.: PCT/EP2021/057458
§ 371 (c)(1),
(2) Date: Sep. 23, 2022

(87) PCT Pub. No.: WO2021/191216
PCT Pub. Date: Sep. 30, 2021

(65) Prior Publication Data
US 2023/0104336 A1  Apr. 6, 2023

(30) Foreign Application Priority Data

Mar. 24, 2020 (SE) ................... 2050319-9

(51) Int. Cl.
*G01R 31/389* (2019.01)
*G01R 31/36* (2020.01)
*G01R 31/396* (2019.01)
(52) U.S. Cl.
CPC ....... *G01R 31/389* (2019.01); *G01R 31/3648* (2013.01); *G01R 31/396* (2019.01)
(58) Field of Classification Search
CPC .............. G01R 31/389; G01R 31/3648; G01R 31/396; G01R 27/02
See application file for complete search history.

(56) References Cited

U.S. PATENT DOCUMENTS 6,208,147 B1   3/2001  Yoon et al.
2005/0021254 A1   1/2005  Merl et al.
(Continued)

FOREIGN PATENT DOCUMENTS

CA   2991036 A1   1/2017
EP   1088240 B1   4/2001
WO   WO-2020003841 A1   1/2020

OTHER PUBLICATIONS

International Search Report and Written Opinion for Application No. PCT/EP2021/057458, dated Jun. 17, 2021.
(Continued)

*Primary Examiner* — Christopher E Mahoney
(74) *Attorney, Agent, or Firm* — MARSHALL, GERSTEIN & BORUN LLP (57) ABSTRACT

The invention concerns a measuring device configured to be connected to first and second terminals of an electric device, such as a battery cell, and to determine at least one electrical property of the electric device. The measuring device comprises an impedance measuring arrangement configured to, when the electric device is connected to the first and second terminals, connect the electric device to a measurement circuit, wherein the impedance measuring arrangement is further configured to: provide a time-varying test current ($I_{test}$) through the measurement circuit; measure a voltage ($U_{cell}$) over the electric device while the time-varying test current ($I_{test}$) is provided; and determine a phase shift and a magnitude ratio between the measured voltage (Ued) and the time-varying test current ($I_{test}$) in the measurement circuit, wherein the time-varying test current ($I_{test}$) comprises a plurality of superimposed discrete frequencies, wherein said discrete frequencies are distributed over a frequency range and separated from each other so as to avoid frequency (Continued)

overlap due to spread spectrum between adjacent frequencies.

25 Claims, 7 Drawing Sheets

(56) References Cited

U.S. PATENT DOCUMENTS

| | | |
|---|---|---|
| 2005/0218915 A1 | 10/2005 | Tinnemeyer |
| 2006/0170397 A1 | 8/2006 | Srinivasan et al. |
| 2008/0238430 A1* | 10/2008 | Page ................. G01R 27/2605 |
| | | 324/649 |
| 2013/0317639 A1 | 11/2013 | Choi et al. |
| 2014/0212730 A1 | 7/2014 | Schaefer |
| 2019/0317152 A1 | 10/2019 | Ballantine et al. |
| 2020/0326380 A1* | 10/2020 | Wuebbeler ........... G01R 31/392 |

OTHER PUBLICATIONS

Office Action in corresponding Application No. SE 2050319-9, dated Nov. 27, 2020.
Joscha Schnell et al., "Quality Management for Battery Production: A Quality Gate Concept", *Procedia CIRP* 57, pp. 568-573 (2016).

* cited by examiner

MEASURING DEVICE AND METHOD FOR DETERMINING AN ELECTRICAL PROPERTY

TECHNICAL FIELD

The invention relates to a measuring device configured to be connected to first and second terminals of an electric device, such as a battery cell, and to determine at least one electrical property of the electric device. In particular, the invention relates to measurement of a complex impedance of the electric device. The invention also relates to a method for determining at least one electrical property of the electric device.

BACKGROUND OF THE INVENTION

There is an increasing interest for using battery packs made up of a plurality of battery cells in various applications, such as for powering of electric or hybrid vehicles or for use as stationary power sources. Presently, there is a particular focus on cells of the Li-ion type.

Typically, the individual cells in a battery pack have somewhat different capacities, for instance due to production variations, and may be at different levels of state of charge (SOC) etc. Most battery packs are provided with a battery management system (BMS) or at least some form of balancing circuit to e.g. prevent overcharging of individual cells and to increase power output and extend life-time of the battery pack. It is generally an advantage if the properties of individual cells differ from each other as little as possible because it makes battery managing and balancing easier and it improves the function of the battery pack. In addition, the charge capacity of a battery pack is normally limited to the capacity of the weakest/worst cell.

The desire to decrease quality fluctuations during production of high-energy batteries has been addressed by Schnell and Reinhart who proposes an improved quality management concept where different measures are taken during the production process (Quality Management for Battery Production: A Quality Gate Concept, Precedia CIRP 57 (2016) 568-573). Exactly which measurements should be made or which deviations should be detected is, however, not specified.

US2014/0212730 discloses a method of producing a battery pack where cells are classified based on measurement of, in particular, change in internal resistance after application of a pressure, whereby cells having similar properties are selected and grouped in corresponding battery packs so as to form battery packs of different quality. This is an interesting concept for forming battery packs with more uniform performance of the cells making up the pack. However, it is not described how the pressure test should be carried out, and the concept is less useful for cells for which pressure does not have any particular or consistent effect on the internal resistance, and it is also less useful in cases where "quality" of a battery cell has a wider or another meaning than internal resistance after application of a pressure.

US2013/0317639A1 relates to automatic checking, validation and post-processing of a "battery object" (cell, cartridge, module or pack) and proposes e.g. the use of a robot (stand-alone or in a production line) holding a test tool capable of performing various tests on the battery object. These tests include measurements of open terminal voltage, loaded terminal voltage, terminal current, internal resistance (or impedance), polarity, isolation, continuity, short circuit and charge/discharge measurements. Based on the measurements, the battery objects may then be graded and classified etc., and all data may be reported and stored in various ways.

Although US2013/0317639A1 mentions the term "impedance" it is not clear if this term is used as a general term for resistance or if it is used to denote a complex impedance that has both a magnitude and a phase that can vary with the frequency of an applied time-varying current. In any case, US2013/0317639A1 provides no information on how to carry out an impedance measurement of the battery object. In particular, no information is provided on how to carry out an impedance measurement that can generate useful and reliable data and that at the same time is sufficiently rapid to be suitable in e.g. a production line where time for making a measurement is limited.

It is known that a thorough measurement of the internal impedance of a battery cell might be useful since it provides information on the interior of the cell. However, such a thorough measurement involves scanning a sinusoidal current over a large frequency band, which takes a long time to complete (if reliable results are desired), so methods of this type are mainly used at laboratories for research purposes. Some quicker on-line impedance test methods have been proposed, for instance based on signals such as pseudo random binary sequences (PRBS), but these methods are generally associated with a larger measurement error.

There is thus still a desire for measurement systems and methods capable of quickly providing reliable information on the quality of the interior of a battery cell or other similar electric device, in particular for use in battery cell (pack) production lines and similar but also for e.g. testing of battery cells already installed in some application or classification of used battery cells.

SUMMARY OF THE INVENTION

The invention concerns a measuring device configured to be connected to first and second terminals of an electric device, such as a battery cell, and to determine at least one electrical property of the electric device.

The measuring device comprises an impedance measuring arrangement configured to, when the electric device is connected to the first and second terminals, connect the electric device to a measurement circuit, wherein the impedance measuring arrangement is further configured to: provide a time-varying test current ($I_{test}$) through the measurement circuit; measure a voltage ($U_{cell}$) over the electric device while the time-varying test current ($I_{test}$) is provided; and determine a phase shift and a magnitude ratio between the measured voltage ($U_{cell}$) and the time-varying test current ($I_{test}$) in the measurement circuit (30, 31), wherein the time-varying test current ($I_{test}$) comprises a plurality of superimposed discrete frequencies, wherein said discrete frequencies are distributed over a frequency range and separated from each other so as to avoid frequency overlap due to spread spectrum between adjacent frequencies.

The phase shift and magnitude ratio between voltage and current form the basis for calculating the internal impedance of the battery cell. Although a final calculation of the impedance is useful in many applications, it is not necessary to make this final calculation since the "raw data", i.e. the voltage-current phase shift and magnitude ratio, already reflect the internal impedance of the cell.

Information on the internal impedance of the cell is useful since it reflects the quality of the interior of the cell. For instance, vague or slight electrode defects may be identified by comparing the determined internal impedance (or the determined "raw data") with reference values for the same type of cell. Such information is otherwise difficult to obtain; for instance, it cannot be obtained by measuring only the voltage or resistance of the cell. Cells that exhibit a sufficiently deviating impedance may, for instance, be sorted out from a production line or be excluded from further use when selecting among used cells. A particular advantage of this is that also cells with slight defects, such as defects that may not be immediately noticed during first use of the cell but that may increase e.g. aging rate of cell or become pronounced during transport to an assembly site, can be identified and removed from the production line at an early stage. At a cell production site, such cells can be removed already at production and at a site for assembling battery packs it can be avoided to include deviating or deficient cells in the pack. Based on the impedance characteristics cells can also be classified into various classes and sorted so that at a later stage one can assemble a pack using the cells that belong to the same class, reducing the cell variations inside a pack, and thus increasing the quality of the pack.

The time-varying test current can include various discrete frequencies depending on which frequencies are of interest for the type of battery cell (or another electric device) to be analysed. Different properties of the cell chemistry and material properties respond to certain frequencies and if there is an interest in some specific properties it is possible to focus the energy of the test current to the corresponding frequencies. The term "time-varying" means that the test current oscillates with some frequency or frequencies, which is in clear contrast to regular DC.

The use of several frequencies or a wide frequency range for determining an internal impedance of e.g. electric circuits is sometimes denoted impedance spectroscopy and is known as such. Conventional impedance spectroscopy is typically used in research to understand the function or investigate aging effects and similar of a circuit or component. Normally, a signal with one single frequency is applied each time and the analysis is relatively time-consuming if many frequencies are to be covered. The frequency range of interest in general impedance spectroscopy is typically in the range 10 mHz to 100 kHz, but wider ranges are tested in research while smaller ranges or even sub ranges can give much information about cell quality.

In the present invention the time-varying test current ($I_{test}$) comprises a plurality of superimposed discrete frequencies, wherein said discrete frequencies are distributed over a frequency range and separated from each other so as to avoid frequency overlap due to spread spectrum between adjacent frequencies. The time-varying test current thus contains several frequencies, maybe hundreds or thousands, that are both separated from each other and, due to the superimposition, that are present at the same time. The separation has the effect that the response from the discrete frequencies, that preferably are selected to provide as much useful information as possible for the particular application, can be analysed without interfering spread spectrum effects from other frequencies that are too close to the frequencies of interest.

The superimposition has the effect that all frequencies can be tested in one single test (instead of performing a sequence of tests with different frequencies). The combined effect is thus that the impedance analysis can be carried out quickly but still produce reliable results.

Compared to conventional impedance spectroscopy, equally reliable results can thus be obtained during a much shorter measurement time period.

Other shorter excitation signals, such as band-limited white noise, PRBS and square pulses, do not contain a selection of separated discrete frequencies but are instead composed of a continuum of frequencies or at least a very large number of unseparated frequencies superimposed into a special signal. Such signals make it more difficult to extract the amplitude and phase effects at each individual frequency, even with sophisticated and more advanced decoding methods.

At least in theory, the time-varying test current generated in the measurement circuit does not necessarily have to be measured but can be determined from information about the signal applied to the measurement circuit. For instance, if all electronic components involved in generating the test current work theoretically perfect or alter a signal only in a fully predictable way, the current in the measurement circuit will be identical to or form a known function of a desired (and known) control signal, such as a time-varying test stimulus signal. However, transistors, amplifiers and other components are likely to at least slightly alter signals in unknown ways, so to get a reliable determination of phase shift and magnitude ratio it is suitable to thoroughly measure the actual test current in the measurement circuit. Measurement of the test current also reduces the requirements on accuracy and performance of the test equipment, which provides for the use of less expensive hardware.

Voltage and current is determined/measured in a synchronized manner to allow for comparison between phase and magnitude.

In a state-of-the-art cell production or battery pack assembly line, with high throughput of cells, there is not much time for making measurements on the individual cells. To still allow for impedance measurements in such production lines it is proposed in this disclosure to use a signal that contains several frequencies superimposed onto each other in the test current provided.

It is also proposed, as an example embodiment, to combine such a signal with integrating the measuring device in an assembly line machine/robot, e.g. an assembly line robot used for gripping, lifting and moving the battery cell in the production line (e.g. from the cell production line into a shipping container or out from a shipping container into a battery pack at a line for assembling of battery packs). This way the impedance measurement can be carried out during lifting and moving of the cell, which will not interfere with the manufacturing of cells or packs. A time period of maybe 20 seconds is then available, but this time window might be selected to be longer or shorter depending on the specific need in the application. The frequencies of the test current can also be adapted to a given maximum time window by leaving out frequencies that are too low to give a meaningful measurement (i.e. the frequencies may have too long periods to give a meaningful measurement).

The term production line station is in this disclosure used to refer not only to a production or assembly line machine/robot but also to e.g. an impedance measurement station that can be more or less integrated with the production line and where the handling and measurement of the cells can be more or less automated. In some variants, the cell may be transferred manually or by means of some kind of gripping robot to an impedance measurement station located somewhat aside of the production line. Moreover, the production line station may be arranged to measure several cells simultaneously, for instance by having a plurality of measuring devices or providing the measuring device with a plurality of impedance measuring arrangements with corresponding cell terminal connections.

However, the measuring device does not necessarily have to be integrated in a production line station but may be used as a separate measuring tool that may be operated manually in various applications.

In an embodiment the impedance measuring arrangement is configured to calculate an internal impedance of the electric device based on the determined phase shift and magnitude ratio.

In an embodiment the impedance measuring arrangement is configured to measure the test current in the measurement circuit.

In an embodiment the time-varying test current provided through the measurement circuit comprises at least a first component forming a direct current component that centres the current through the measurement circuit at a certain current magnitude and a second component that is a time-varying test stimulus signal and that generates the time-variation of the time-varying test current when combined with the first component.

In an embodiment the first component of the time-varying test current is drawn from the electric device. No external power source is thus needed since it is not necessary to drive a current into the electric device. This typically applies to the case where the electric device is a (charged) battery cell.

In an embodiment the impedance measuring arrangement comprises current stimulus circuitry configured to generate the time-varying test stimulus signal.

In an embodiment the impedance measuring arrangement comprises a transistor configured to receive the time-varying test stimulus signal and to control the first component of the time-varying test current.

In an embodiment the impedance measuring arrangement comprises current sensing circuitry configured to generate a signal representing the test current in the measurement circuit.

In an embodiment the impedance measuring arrangement comprises voltage sensing circuitry configured to measure a voltage between the first and second terminals.

In an embodiment the impedance measuring arrangement comprises a data acquisition system connected to the current stimulus circuitry, the current sensing circuitry and the voltage sensing circuitry, wherein the data acquisition system comprises a computation circuitry configured to calculate, based on the test current and the voltage, an internal impedance of the electric device.

In an embodiment the impedance measuring arrangement comprises a feedback loop configured to: measure the signal representing the test current in the measurement circuit; compare this signal with the time-varying test stimulus signal; and adjust an input voltage to the transistor so as to improve agreement between the two signals in the measurement circuit. This feedback arrangement compensates for nonlinear characteristics inherent in the transistor and ensures that the test current will follow the test stimulus.

In an embodiment the time-varying test current contains at least one discrete frequency within the interval 10 mHz to 100 kHz. Preferably, the time-varying test current contains a plurality of superimposed frequencies within the interval 10 mHz to 100 kHz.

When designing the time-varying test current ($I_{test}$) or the time-varying test stimulus signal, there are two limiting variables that should be considered: i) sampling frequency $f_s$; and ii) total time T for providing the time-varying test current ($I_{test}$) (i.e. total duration of the stimuli). These variables set the limits for the measurable frequency range in that $f_s$ sets the highest attainable frequency, which is the Nyquist frequency $f_s/2$, while T sets a limit for the lowest frequency $f_L=1/T$ (which in the following also is referred to as the fundamental frequency). Within these limits it can be selected a lowest frequency $f_l$ and a highest frequency $f_h$ to be used in the measurement and, together with a plurality of frequencies selected within this interval, these are the frequencies used in the measurement for determining the impedance. This frequency interval is thus limited by $f_h<f_s/2$ and $f_l>f_L$.

Sampling frequency $f_s$ is selected to be more than twice of the highest frequency of interest, and can typically be chosen within the range 50 kHz to 1 MHz. This is a cost issue as a device with a higher sampling frequency generally is more expensive than one with a lower.

Time of measurement T depends on the application but may typically be in the range 1-100 s. Shorter or longer times are, however, also possible depending on the time that is available for performing the test, the purpose of the measurement and which frequencies that are of interest. A typical time available in a production line might be a few seconds, maybe 3-20 s.

A further signal design variable is to set a minimum value for a separation $f_d$ between adjacent discrete frequencies to avoid (significant) interference (i.e. frequency overlap) due to spread spectrum. Thus, the frequencies should be separated such that the difference between adjacent frequencies is $f_{d,min}$ or more, i.e. the higher frequency should be at least $f_{d,min}$ Hz higher than the preceding lower frequency in an adjacent pair of discrete frequencies.

The minimum value $f_{d,min}$ for the frequency separation $f_d$ can be related to the lowest frequency postulated by $f_L=1/T$. A recommended separation is to have an $f_d$ that is larger than $8*f_L$. A minimum value for the separation $f_d$ can be set to $4*f_L$. An $f_d$ of $10*f_L$ or more is sufficient for most cases. Accordingly, $f_{d,min} \geq 4*f_L=4/T$, preferably $f_{d,min} \geq 8*f_L=8/T$, and more preferably $f_{d,min} \geq 10*f_L=10/T$.

If adjacent frequencies do interfere significantly, it leads to higher errors in the impedance calculated from the current and the voltage. If some interfering frequencies for some reason are present in the time-varying test current ($I_{test}$), these frequencies may be left out in the calculations.

Preferably, the signal energy of the frequencies between the discrete test frequencies, i.e. over the frequency separation range $f_d$, is zero or close to zero. This leads to a high signal-to-noise ratio and a more reliable decoding of the signal. Some signal energy between the discrete frequencies may be acceptable depending on the application. The amplitude/signal energy between a discrete test frequency and an upper or lower adjacent discrete test frequency should be <10%, preferably <1%, or more preferably <0.1% of the amplitude/signal energy of one of said two adjacent discrete frequencies.

A further signal design measure, a fine-tuning step, is to balance different frequency regions. If a certain frequency region is more important for the particular electric device or battery cell to be analysed, it is possible to assign a higher amplitude/signal energy for the discrete frequencies in this region to improve the signal to noise ratio.

The frequencies and test-time T to be used are preferably selected and pre-set before the measurement. The values to choose depend e.g. on the properties of the electric device/battery cell and the time available, and should thus be adapted to the needs of the particular application.

As an example, if a measurement is desired to cover the range 1 Hz-100 kHz we get that $f_l=1$ Hz (=base frequency) and $f_h=100$ kHz. A sampling frequency of $f_s=1$ MHz may then be selected and a time of measurement T=3 s so as to fulfil the conditions given above ($f_h<f_s/2$ and $f_l>f_L$, where $f_L=1/T=\frac{1}{3}=0.333\ldots$ Hz). With $f_f=1$ Hz and T=3 s this now corresponds to the third harmonic in the sequence, meaning that the first frequency component (the base frequency) will be $f_f=3f_L$. It can now be selected a minimum frequency separation $f_{d,min}$ of e.g. 10 times the fundamental frequency (i.e. a frequency gap of 10 times ⅓ Hz=3.333 Hz is added between the discrete frequencies starting from the base frequency) to avoid spread-spectrum effects. This gives $f_f=f1=3*f_L$, $f2=13*f_L$, $f3=23*f_L$, $f4=33*f_L$ etc, all in all resulting in 30000 simultaneous discrete test frequencies up to $f_h$=100 kHz.

With the above selection of parameters some test frequencies will be overtones to other lower frequencies, for example f4=11*f1, which can have a negative influence on the measurement. Such interfering overtones can be avoided by using a sequence of primes when setting the frequency separation $f_d$. For instance, using $f1=3*f_L$ as the lowest frequency (the base frequency) as in the example above, the "3" is the first prime. Using a minimum frequency separation factor of 10, as above, the next prime to select that gives a frequency that is at least 10 numbers higher than the preceding frequency is 13, the next one 23, etc. In the example given here the following sequence is obtained when using primes for determining the discrete frequencies: $f1=3*f_L$ (1 Hz), $f2=13*f_L$ (13/3 Hz), $f3=23*f_L$ (23/3 Hz), $f4=37*f_L$ (37/3 Hz), $f5=47*f_L$ (47/3 Hz), etc. With such a frequency separation and frequency sequence no interfering spread-spectrum effects appear and no overlapping and interfering overtones will be generated. In this example this will give a test signal with 16078 ($f_1$-$f_{16078}$) discrete test frequencies. The signal energy of all other frequencies are preferably set to zero.

In the above example it would have been possible to include $f_s/2*3=1\,500\,000$ test frequencies if all available frequencies were used. However, this would have led to spread spectrum interference and overlapping overtones, which in turn would have a negative influence on the decoding of the impedance.

A sequence of the above type can in theory contain down to only two frequencies but in practice it typically contains hundreds or thousands of frequencies.

It is not necessary that the time-varying test current contains all frequencies in a sequence of the above type. For instance, the signal energy may for some reason be set to zero for f2 in the sequence above so that the lowest frequencies will be f1, f3, f4, etc.

In principle, the lowest frequency f1 (the base frequency) in a frequency sequence could be anywhere in the interval between the lowest and highest possible frequencies $f_L$ and $f_s/2$, respectively, except for very close to the highest frequency since there is then no room for additional frequencies. In practice, however, the lowest frequency f1 (the base frequency) in the frequency sequence is set to be relatively close to the lowest possible frequency $f_L$.

Embodiments of the time-varying test current ($I_{test}$), i.e. besides that it comprises a plurality of superimposed discrete frequencies, wherein said discrete frequencies are distributed over a frequency range and separated from each other so as to avoid frequency overlap due to spread spectrum between adjacent frequencies, include:

said adjacent frequencies are separated by a minimum frequency separation, $f_{d,min}$, wherein $f_{d,min} \geq 4*f_L=4/T$, preferably $f_{d,min} \geq 8*f_L=8/T$, and more preferably $f_{d,min} \geq 10*f_L=10/T$, wherein $f_L=1/T$ and wherein T is the total time for providing the time-varying test current;

said plurality of frequencies form a frequency sequence comprising a lowest frequency, f1, and at least one higher frequency, f2, f3 . . . $f_h$, wherein any one of frequencies f2-$f_h$ divided by frequency f1 does not yield an integer;

wherein any one of frequencies f1-$f_h$ divided by the fundamental frequency $f_L$ yields a prime number;

f1 is related to a total time T of providing the time-varying test current such that f1=N*1/T where N>2;

wherein N is a prime number;

wherein said plurality of superimposed discrete frequencies comprises at least 10 discrete frequencies, preferably at least 100, and more preferably at least 1000 discrete frequencies.

wherein a total time T for providing the time-varying test current is 100 s or less;

wherein a signal energy between a discrete frequency and an upper or lower adjacent discrete frequency is <10%, preferably <1%, or more preferably <0.1% of the signal energy of one of said two adjacent discrete frequencies;

wherein a signal energy between a discrete frequency and an upper or lower adjacent discrete frequency is zero or close to zero.

When the frequencies and the frequency separations etc. to be used in the measurement have been determined, it is time for a next step in the generation of the test signal. It is an advantage to ensure that the amplitude of the signal becomes limited to allow generation of the signal with a hardware device. This may be done by flipping the phase of the selected test frequencies between 0 and 180 degrees, according to a random number sequence. The signal with its frequencies and phases is a defining description of the signal in the frequency domain.

Now it is possible to transform the frequency contents using an inverse discrete time fourier transform, which defines the shape of the test signal in the time domain ($I_{tim}$). One thing is also to determine the magnitude of the current to be used when testing the battery cell (or another electric device). A smaller battery cell should generally be tested with a smaller current. For instance, a certain amplitude $I_{ampl}$=1 A might be desired, then the test current is obtained from $I_{test}=I_{ampl}*I_{tim}/\max(I_{tim})$, where $\max(I_{tim})$ means the maximum value in $I_{tim}$. A signal that has the desired amplitude and the desired frequencies can now be generated.

In an embodiment the measuring device is integrated into a production or assembly line machine/robot. Preferably, the production or assembly line machine/robot is configured to grip and/or lift the electric device/battery cell.

In an embodiment the first and second terminals form a positive pole and a negative pole, respectively, of a battery cell, which may be of the Li-ion type.

The invention also concerns a method for determining at least one electrical property of an electric device, such as a battery cell, by connecting a measuring device to first and second terminals of the electric device.

The method is characterized in that it comprises the steps of:

connecting the electric device to a measurement circuit of an impedance measuring arrangement arranged in the measuring device;

providing a time-varying test current through the measurement circuit;

measuring a voltage over the electric device while the time-varying test current is provided; and determining a phase shift and a magnitude ratio between the measured voltage and the time-varying test current in the measurement circuit, wherein the time-varying test current ($I_{test}$) comprises a plurality of superimposed discrete frequencies, wherein said discrete frequencies are distributed over a frequency range and separated from each other so as to avoid frequency overlap due to spread spectrum between adjacent frequencies.

Embodiments of the method may comprise one or several of the following steps:
- calculating an internal impedance of the electric device based on the determined phase shift and magnitude ratio;
- measuring the test current in the measurement circuit;
- providing the time-varying test current through the measurement circuit by: providing at least a first component forming a direct current component that centres the current through the measurement circuit at a certain current magnitude; providing a second component that is a time-varying test stimulus signal and that generates the time-variation of the time-varying test current; and combining the first and second components;
- drawing the first component of the time-varying test current from the electric device;
- generating the time-varying test stimulus signal by means of a current stimulus circuitry;
- receiving the time-varying test stimulus signal at a transistor arranged in the impedance measuring arrangement;
- controlling the first component of the time-varying test current by means of the transistor;
- generating a signal representing the test current in the measurement circuit by means of a current sensing circuitry arranged in the impedance measuring arrangement; and/or
- gripping and/or lifting the electric device by means of a production or assembly line machine/robot into which the measuring device is integrated while applying the test current and measuring the voltage response over the electric device.

In embodiments of the method the time-varying test current may have properties as already mentioned above.

BRIEF DESCRIPTION OF DRAWINGS

In the description of the invention given below reference is made to the following figures, in which.

DESCRIPTION OF EXAMPLE EMBODIMENTS OF THE INVENTION

Figure 1:
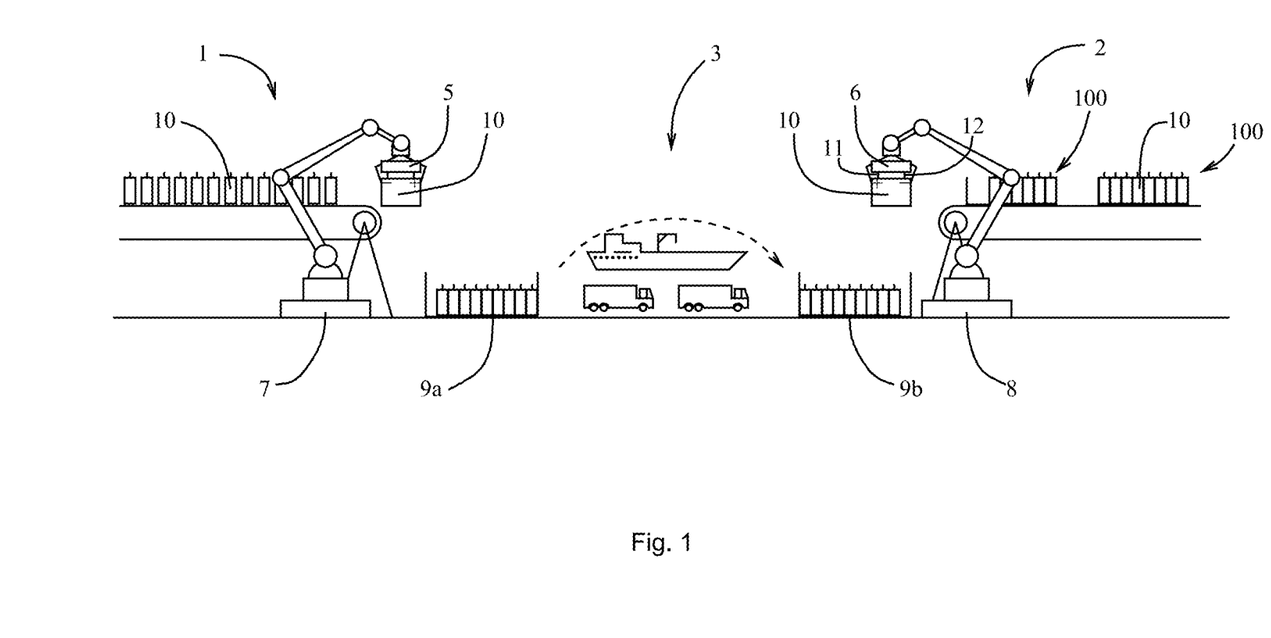
FIG. 1 shows, in a schematic view, an example of a production line for producing battery cells and an example of a production line for assembling of battery packs comprising a plurality of battery cells.

FIG. 1 shows an example embodiment where a measuring device according to this disclosure has been integrated into a production line robot in a production line, and where the measuring device is arranged to carry out measurements on battery cells.

FIG. 1 shows a first production line 1 for production of battery cells 10 (denoted "C" in FIGS. 2 and 3) and a second production line 2 for assembling battery packs 100 containing a plurality of battery cells 10. In this example each production line 1, 2 comprises a measuring device 5, 6 configured to be connected to first and second terminals 11, 12 of a battery cell 10 in the corresponding production line 1, 2 and to determine, by means of an impedance measuring arrangement 20, 21 (see FIGS. 2-3), an impedance of the battery cell 10. The measuring device 5, 6 is provided with first and second connection members (not shown) adapted to be connected to the first and second cell terminals 11, 12, respectively.

As shown in FIG. 1, a transportation of cells 10 from the first to the second production line 1, 2 is indicated by some vehicles/vessels 3. It is thus indicated in FIG. 1 that the two production lines 1, 2 are located at different sites. Cell production and assembling of battery packs may, however, be more or less integrated with each other at the same site in which a particular transportation between the two separated production lines 1, 2 may not be needed. FIG. 1 is intended to illustrate that the invention, when applied in a production line related to battery cells, is applicable in production lines for both manufacturing of cells and assembling of battery packs and that these lines may or may not be located at a considerable distance from each other.

FIG. 1 further shows that each production line 1, 2 comprises a production line station in the form of first and second production line robots 7, 8 for gripping/holding, lifting and moving of battery cells, in particular for placing battery cells 10 (in this case one by one) into a shipping container 9a at the cell production line 1 and for lifting up individual battery cells 10 from a shipping container 9b and placing them in the battery pack 100 at the battery pack assembly line 2. In case the two production lines 1, 2 are integrated there is no need to place battery cells 10 into shipping containers 9a, 9b (but perhaps into some sort of storage containers) and it may be sufficient to use only one production line robot 7, 8. Any particular production line gripping apparatuses, such as the robots 7, 8 shown in FIG. 1, are not required for this embodiment but provides for a suitable embodiment where the measuring device 5, 6 is integrated into the production line apparatus 7, 8.

FIG. 1 further shows that the measuring device 5, 6 is arranged onto, or integrated in, each robot 7, 8 in connection with a gripping tool of the robot 7, 8 used to grip the battery cell 10. This means that the measuring device 5, 6 will be positioned close to the cell 10 during gripping, lifting and moving of the cell 10. This allows the measuring device 5, 6 to be connected to the terminals 11, 12 when the robot 7, 8 grips the cell 10 and to maintain the connection during lifting and moving of the cell 10 until the cell 10 is released in the shipping container 9a or in the battery pack 100. During the time period spent on lifting and moving of the cell 10, perhaps around 10-20 s in a typical production line of interest here, the measuring device 5, 6 can carry out measurements on the cell 10, and these measurements can thus be carried out without delaying the production process and even without affecting the production process at all. By properly positioning and fixing the measuring device 5, 6 to the corresponding robot/production line apparatus 7, 8 and making sure that the gripping tool holds the cell 10 steady during lifting and moving, the measuring device 5, 6 will not move in relation to the cell 10 during lifting/moving. This simplifies securement of the electric connection between the cell terminals 11, 12 and the measuring device 5, 6. The connection members may be integrated with the gripping tool of the robots 7, 8.

Figure 2:
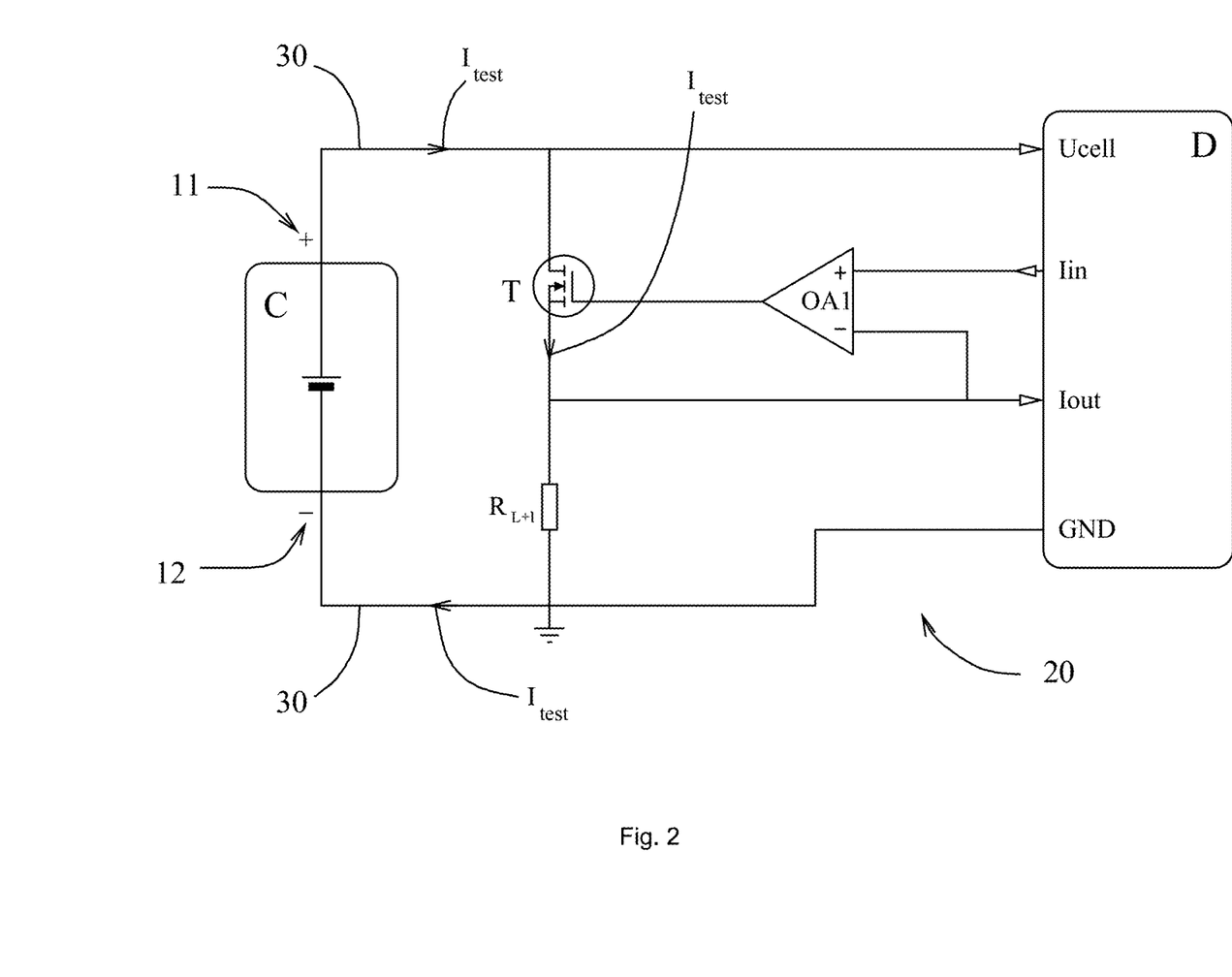
FIG. 2 shows, in a schematic view, a first embodiment of an impedance measuring arrangement suitable for a measuring device for use in e.g. the production lines shown in FIG. 1.
Figure 3:
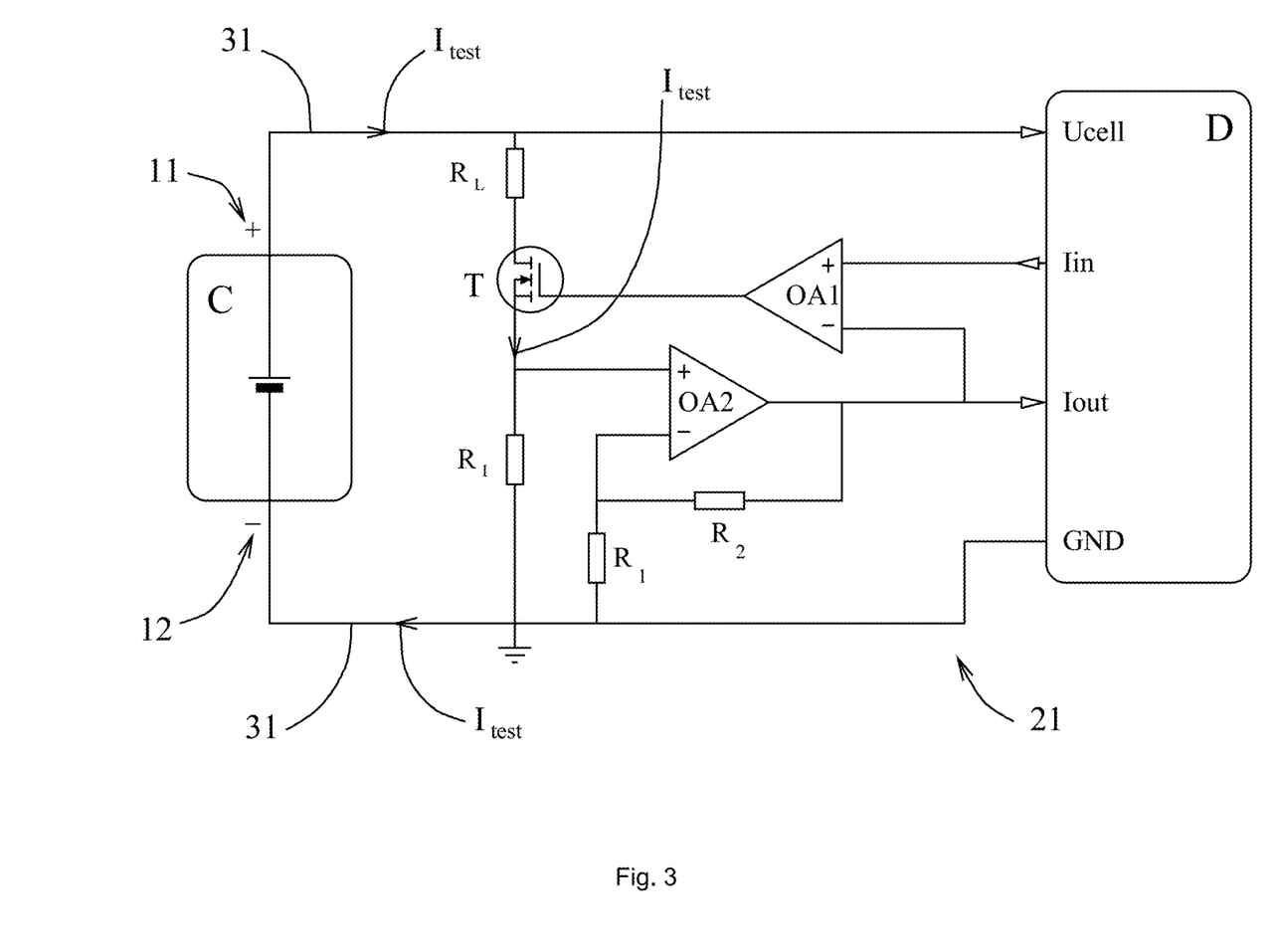
FIG. 3 shows, in a schematic view, a second embodiment of an impedance measuring arrangement suitable for a measuring device for use in e.g. the production lines shown in FIG. 1.

As will be further described in relation to FIGS. 2 and 3, the impedance measuring arrangement 20, 21 is configured to, when connected to the first and second terminals 11, 12, connect the battery cell 10, C to a measurement circuit 30, 31. The impedance measuring arrangement 20, 21 is further configured to apply a time-varying test current through the measurement circuit 30, 31. In the examples shown, this is carried out by drawing a DC current from the cell 10, C subject to the measurement (i.e. no external power source is needed in these examples) and applying a time-varying stimulus signal $I_{in}$ to the drawn current in the measurement circuit 30, 31. The time-varying test current is thus composed of two components; the current drawn from the cell 10, C forms a first component and the time-varying stimulus signal $I_{in}$ forms a second component.

The impedance measuring arrangement 20, 21 is further configured to measure, while the time-varying test current is applied (and thus also the stimulus signal $I_{in}$), a voltage $U_{cell}$ over the battery cell 10, C and the test current $I_{test}$ in the measurement circuit 30, 31. The test current $I_{test}$ is likely to differ at least slightly from the (in this case known) oscillating pattern of the stimulus signal $I_{in}$ because of non-linearity or temperature effects etc. of various electronic circuit components. Therefore, the test current $I_{test}$ in the measurement circuit 30, 31 is measured.

The impedance measuring arrangement 20, 21 is further configured to determine a phase shift and a magnitude ratio between the measured voltage $U_{cell}$ and test current $I_{test}$. These data can be used to calculate the internal impedance of the battery cell 10, C. How to calculate the impedance is well known to a person skilled in the art.

It should be noted that what is said about the impedance measuring arrangement 20, 21 is general preferable also when the measuring device 5, 6 is used in another embodiment than exemplified in FIG. 1.

The determined impedance (or the determined phase shift and a magnitude ratio) can be compared to reference data and be used to identify potential defects inside the cell 10, C, such as defects in an electrode or in the electrolyte or defects in the interface between electrode and electrolyte. Different frequencies of the time-varying test current $I_{test}$ provide different kind of information on a particular type of cell 10, C and certain frequencies may be more useful than other for different types of cells. The time-varying test current $I_{test}$ (or rather, in this example, the stimulus signal $I_{in}$) may be adapted to the type of cell 10, C to be analysed, i.e. the test current may comprise one or several selected frequency ranges that have significantly higher amplitudes. It is also possible to include a very large number of discrete frequencies in the test current but not necessarily analyse all frequencies but instead make a selection of frequencies in the next step(s) (i.e. in the voltage and current measurements and/or in the determination/calculation of the impedance).

FIG. 2 shows an impedance measuring arrangement 20 according to a first embodiment. The poles Po+ 11 and Po− 12 of the cell C (that corresponds to cell 10 in FIG. 1) are connected in a first measurement circuit 30, which comprises also a current controlling transistor T and a combined load and current measurement resistor $R_{L+I}$. The second connection point Po− is connected to a common ground GND. The transistor, T, is here a MOSFET-transistor, but could also be another type of transistor, such as an bi-polar transistor.

The measurement circuit 30 has the function of being loading only, i.e. it is capable of pulling current from the cell C subject to the impedance measurement. This has the advantage that there is no need for a power supply that charges the cell C, which makes the measurement device 5, 6 simple and suitable for implementation in e.g. a cell and/or pack production line. It is the arrangement with a transistor T and loading resistor $R_{L+I}$, that limits the operation so the current can only flow in the direction indicated. This passive design makes the circuit able to only pull energy/current from the cell C.

The function of the loading resistor, $R_{L+I}$, is twofold: 1) it forms a loading resistor that dissipates the power extracted from the cell C, and 2) it forms a current measurement resistor where the voltage over the resistor gives information about the test current $I_{test}$ in the measurement circuit 30 through Ohms law; a signal $I_{out}$ is generated that represents the actual test current $I_{test}$ in the measurement circuit 30. The dimensioning of the resistor $R_{L+I}$ can for example be 1.0Ω, giving a maximum current from the cell C of $I_{max}$=4 A for a cell voltage of 4 V, and a maximum power dissipation of 16 W, in the resistor. The accuracy of the resistor will determine the precision of the measurement of the test current $I_{test}$. (The signal representing the test current $I_{test}$ is actually a voltage signal but is denoted $I_{out}$, and not e.g. $U_{out}$, to indicate that the signal is a measure of a current.)

The transistor T together with an operational amplifier OA1, and the resistor $R_{L+I}$ constitute a voltage controlled current stimulus source. This source controls the time-variation of the current in the measurement circuit 30 based on a time-varying stimulus signal $I_{in}$ provided as an output voltage by a digital-to-analog converter in a data acquisition system D. (The time-varying test stimulus signal $I_{in}$ is actually a voltage signal but is denoted $I_{in}$, and not e.g. $U_{in}$, to indicate that this signal controls the test current.)

Without the voltage controlled current source and its control stimulus signal $I_{in}$, the measurement circuit 30 would form a simple DC circuit. The test stimulus signal $I_{in}$ is a time-varying signal, i.e. it varies with certain frequencies etc., and when this stimulus signal is applied, via transistor T, to the current drawn from the cell C it generates a corresponding time-variation or oscillation in the current in the measurement circuit 30. (The corresponding time variation in the measurement circuit 30 does not necessarily exactly reflect that of the stimulus signal $I_{in}$ due to influences from electronic components, see above, and therefore the actual test current $I_{test}$ is measured in the embodiment described.) The time-varying test current has thus been applied through the measurement circuit 30. The test current may, however, be applied in other ways.

The time-varying test current $I_{test}$ may be selected to vary in accordance with the applied frequencies around an average of $I_{max}/2$ A, that depends on the selected resistance. Because of the impedance of the cell C (or other electric device to be measured) there will be, at least at certain frequencies or frequency ranges, some difference in phase between the test current $I_{test}$ in the measurement circuit 30 and the voltage $U_{cell}$ over the cell C. By measuring the test current $I_{test}$, via the signal $I_{out}$, and the voltage $U_{cell}$ simultaneously the impedance and its magnitude and phase can be calculated.

The transistor T with the operational amplifier OA1 coupled as a voltage follower is a feedback loop controlling the current in the resistor $R_{L+I}$ by adjusting the voltage at the gate of the transistor T. The feedback loop is provided to reduce the influence of nonlinearities in the transistor T and other components. It produces a transistor gate signal that will make the test current $I_{test}$ follow the desired test stimulus $I_{in}$ and so that the desired spectrum of the test current $I_{test}$ is achieved and the cell behaviour at certain frequencies can be tested as desired. With the feedback the test signal will be controlled so that it gets the desired spectrum. Without the feedback there is a risk that the nonlinearity of the transistor would influence the signal and thereby produce a test signal that differs from the desired test stimulus and thus testing the cell at other frequencies than desired.

Thanks to the feedback loop an $I_{in}=3V$ will give a voltage over $R_{L+I}$ of 3V and thus $I_{out}=3V$ which, with a resistance of $R_{L+I}=1\Omega$, will correspond to a current of $I_{test}=3$ A. With the resistance $R_{L+I}=1\Omega$, used for illustration in this example, we have one-to-one correspondence between voltage and current and other values of the resistance $R_{L+I}$ will give other current and voltage relations according to Ohm's law $I_{test}=I_{out}/R_{L+I}$.

The measurement circuit 30 is connected to the data acquisition system D that has four connections: $U_{cell}$, $I_{in}$, $I_{out}$ och GND.

GND is a common ground and forms a reference level. GND is connected to the negative pole 12 of the cell C and to the loading resistor $R_{L+I}$.

The test signal $I_{in}$ that is used as a stimulus for the current in the measurement circuit 30 is generated by a digital-to-analog converter (not shown) and sent to the current control amplifier OA1.

The test current $I_{test}$ is measured with the aid of the loading resistor $R_{L+I}$ and a first analog-to-digital (AD) converter (not shown) in the data acquisition system D arranged to be connected with the input for the signal $I_{out}$ that represents the test current $I_{test}$. The measured voltage of the signal $I_{out}$ is used to calculate the test current $I_{test}$ with the aid of Ohm's law $I_{test}=I_{out}/R_{L+I}$.

The fourth connection, $U_{cell}$, is connected to a second AD converter (not shown) that measures the cell voltage and registers how it responds to the test current $I_{test}$, i.e. how it responds to the current formed by applying the time-varying stimulus signal $I_{in}$ to the current drawn from the cell C. The first and second AD converters are synchronized so that the amplitude ratios and phase shifts between the representation $I_{out}$ of the test current $I_{test}$ and the voltage $U_{cell}$ can be detected/measured at different frequencies.

Instead of using first and second analog-to-digital converters for providing voltage and current signals, it is possible to use a single analog-to-digital converter provided with additional sample and hold circuits that are triggered simultaneously and use a multiplexer to shift the inputs and thereby provide voltage and current signals that are measured synchronously.

FIG. 3 shows a second embodiment of the impedance measurement arrangement 21. It works according to the same basic principle as the first embodiment (FIG. 2) where a current is drawn out of the cell C and is controlled in a time-varying manner by the transistor T. The main difference is that the resistor $R_{L+I}$ of the first embodiment (FIG. 2) is split into two resistors: one loading resistor $R_L$ and one current measuring shunt resistor $R_I$. The loading resistor $R_L$ takes up/dissipates the power extracted from the cell C, and it is particularly dimensioned to be capable of being heated up and to dissipate the power as heat. In this second embodiment, the shunt resistor $R_I$ is selected small so that it will dissipate only small amounts of power and heat up only to a low degree. This reduces the potential influence of the temperature on the current control and measurement, since the resistance of the shunt resistor $R_I$ can be dependent on the temperature. With this arrangement, a temperature variation that would cause changes in $R_L$ will not influence the accuracy of the signal $I_{out}$ representing the test current $I_{test}$ thanks to the feedback loop.

Since the shunt resistor $R_I$ is small the voltage over it will also be low and the voltage signals $I_{out}$ representing the actual test current $I_{test}$ will be small. To increase the accuracy of the current measurement/calculation at the data acquisition system D and the accuracy of the current control at OA1, a second amplifier OA2 is implemented to amplify the original $I_{out}$-signal generated at the shunt resistor $R_I$. The gain of the second amplifier OA2 is selected with the resistors $R_1$ and $R_2$. The amplified signal $I_{out}$ is measured in the first AD converter and also fed to the current feedback controller that controls the transistor, T. The data acquisition system D measures $I_{out}$ and $U_{cell}$ in the same way as described in relation to the first embodiment in FIG. 2.

The resistance of the load resistor $R_L$ is preferably selected so as to be adapted to the capacity and voltage of the battery cell C to be measured and to how much current is desired to be drawn from the battery cell C. As an example, if it is of interest to perform tests with high currents reaching 60 A the load resistor $R_L$ may have a resistance of 0.06 Ohm. However, almost any resistance might be used.

The resistance of the shunt resistor $R_I$ should in principle be as small as possible (without generating a too weak signal) and it should also be calibrated and thermally stable in order to ensure proper measurement. As an example, the shunt resistor $R_I$ may have a resistance of 0.1 mOhm. However, almost any other resistance may be used.

The third resistor $R_1$ may have a resistance of 10 Ohm while the fourth resistor $R_2$ may have a resistance of 10 kOhm. However, other values can be chosen for these components. In order to achieve a desired amplification with regards to the second operational amplifier OA2, to give a high gain, the fourth resistor $R_2$ may have a significantly larger resistance than the third resistor $R_1$. The third resistor $R_1$ may for instance have a resistance of 1-100 Ohm, while the fourth resistor $R_2$ may have a resistance of 1-100 kOhm.

To increase accuracy of current control and measurements it is beneficial to apply state of the art in the selection of components (e.g. A/D, D/A and OP). Further, the A/D converters could be coupled for differential measurement so that the voltage over each component is measured, instead of making the measurement against a common ground reference. This would make the signals less sensitive to noise on the common ground. Additional improvements can be achieved by employing a system with four-wire measurement, i.e. using two wires to measure the current and generate $I_{out}$, using $R_{L+I}$ or $R_I$ as in circuits 20 and 21 respectively, and two wires directly connected to the cell poles 11 &12 for measuring the cell voltage. In this case, differential measurements are also preferable, where both pairs of wires are coupled to differential A/D input channels. It is possible to design the measurement circuit in other ways. As an example, the current sensing resistor $R_I$ could be replaced with another current sensor technology, e.g. a Hall effect based transducer. Another measure to increase the accuracy is to arrange the cell voltage measurement so that it measures the variations around the nominal cell voltage with high accuracy.

In order for the impedance measurement to be conducted during a short time interval, e.g. the brief time-window of attaching/gripping, lifting, transporting, placing and detaching the battery cell 10/C as described in relation to FIG. 1, there is a need of having a time-efficient measurement. This is achieved by a multi-frequency signal $I_{in}$ sent from the digital-to-analog converter of the data acquisition system D to the control gate of the transistor T for controlling the current drawn from the battery cell 10/C, which generates a similar multi-frequency test current $I_{test}$. The multi-frequency signal can for instance be a multi-sine signal comprising sine signals corresponding to a predetermined set of discrete frequencies to be measured. It can also be another type of signal comprising the discrete frequencies to be measured.

Figure 4:
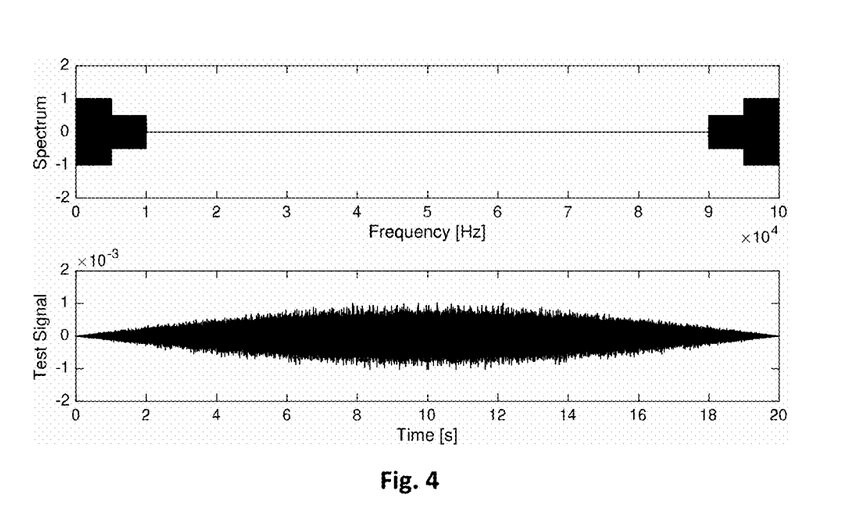
FIG. 4 shows an example of a time-varying test stimulus signal that can be used to generate a time-varying test current; the upper plot shows frequency contents of the signal and highlights that different amounts of energies can be used at different frequency ranges; the bottom plot shows the resulting signal that contains the frequency spectrum from the upper plot.

FIG. 4 shows an example of how a test stimulus signal could be designed. It shows the signal in the frequency domain (top) and time domain (bottom). The upper diagram shows the signal's energy contents in the frequency domain. The areas that have energy are indicated by black areas, the signal energy is concentrated to low frequencies; the lowest range 0-5 kHz have highest energy contents and the range 5-10 kHz has a lower energy, while the range 10-50 kHz does not have any energy and is thus zero. The spectrum for real signals is symmetric around half the sampling rate (100 kHz), this explains why the low frequency region 0-10 kHz is mirrored to 100-90 kHz. Furthermore the phase of the individual frequencies are randomly altered between 0 and 180 degrees, this is performed so that the time domain signal will have a limited and balanced amplitude.

The lower diagram in FIG. 4 shows the resulting time-varying test signal, i.e. the test stimulus signal $I_{in}$. The time domain signal is generated from the spectrum using the inverse discrete fourier transform and therefore contains the selected frequency contents. The symmetry of the spectrum and the random phase shift gives time domain signal that starts with an amplitude of 0 and attains the highest amplitude in the center without growing to too large amplitudes. There are many signals that have the same spectral properties, but preferably a test signal is selected that has a balanced and limited amplitude, like the one in the lower diagram of FIG. 4, so that it is possible and easy to realize it in the D/A converter and current controller. Signal generation as such is well known to a person skilled in the art.

Analysis of the measured voltage $U_{cell}$ over the cell 10, C and the test current $I_{test}$, via the signal $I_{out}$, in the measurement circuit 30, 31 may be carried out using e.g. fast fourier transform (FFT) or any other suitable signal processing method for frequency analysis.

The measuring device 5, 6, and in particular the impedance measuring arrangement 20, 21, is preferably designed to be capable of generating the desired discrete frequencies to the test current applied to the measurement circuit 30, 31 whatever is deemed interesting for the type of cell or other electric device concerned. (It should of course also be designed to be capable of measuring the voltage and current at these frequencies and be capable of analyzing the measured data.)

Figure 5:
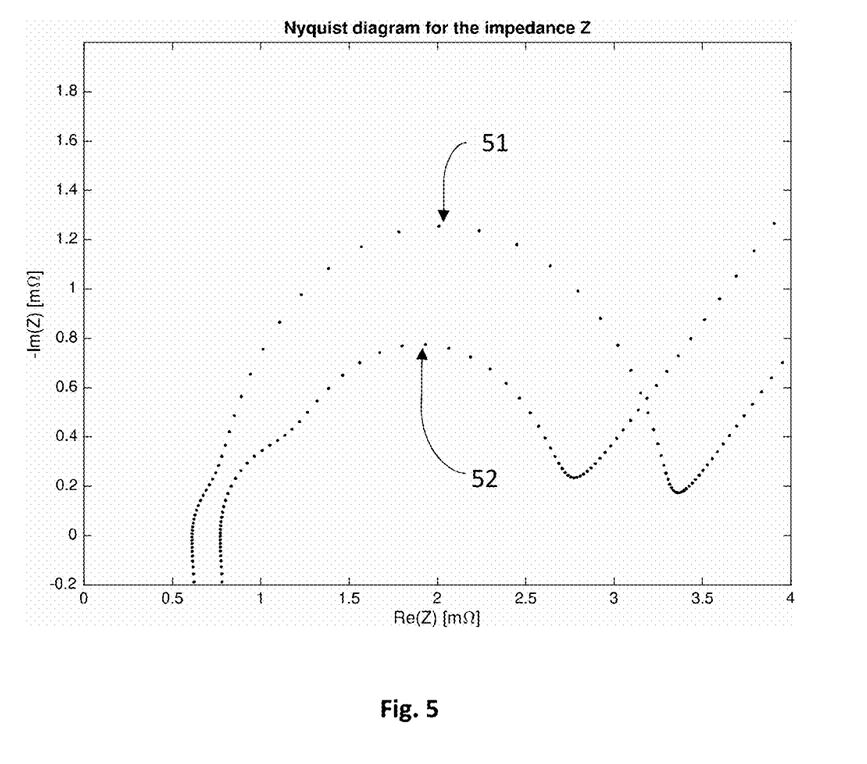
FIG. 5 shows examples of Nyquist plot impedance spectra for a first and a second battery cell impedance measurement; each spectrum shows simultaneously the phase and magnitude of the complex impedance; each dot represents the complex valued impedance for a single frequency and entails the magnitude and phase by its position in the complex plane.

FIG. 5 shows an example of a spectrogram that results from an impedance spectroscopy analysis. In the plot the amplitude and phase of the frequency response is visualized in a complex valued plot, called Nyquist diagram, where the x-axis corresponds to the real value and the y-axis to the imaginary values with negative sign (this representation is selected for agreement with the spectroscopy community that use this representation for historical reasons).

FIG. 5 illustrates how impedance measurements can be used to identify a cell with potential defects or deviations, and FIG. 5 also forms an example of (sets of) reference values that can be compared to identify cells with potential defects or deviations. A first (upper/left) series of dots 51 shows the impedance spectrum of a new Li-ion battery cell and a second (lower/right) series of dots 52 shows the impedance spectrum of the same battery cell after ageing. That is, the first series 51 represents a set (a series) of reference values and the second series 52 represents a similar cell with defects. Various methods may be applied to automatically (mathematically) compare spectra and decide whether a certain cell exhibiting a certain impedance spectrum should be classified as defect or not.

If the internal impedance of an individual cell or other electric device deviates from a reference value (or from a series of reference values) with more than a certain margin, this individual cell may be sorted out from the production line 1, 2 or sorted out from some other selection process or be classified in different ways, etc. Alternatively or supplementary, data related to the internal impedance of the battery cell may be stored in a database. Such data may for instance be the determined internal impedance at discrete frequencies, or may be a parameterization of the spectrum constituted by the internal impedance at the discrete frequencies. This data could then for instance be used later to follow up discrepancies when handling a faulty battery pack in use.

Figure 6:
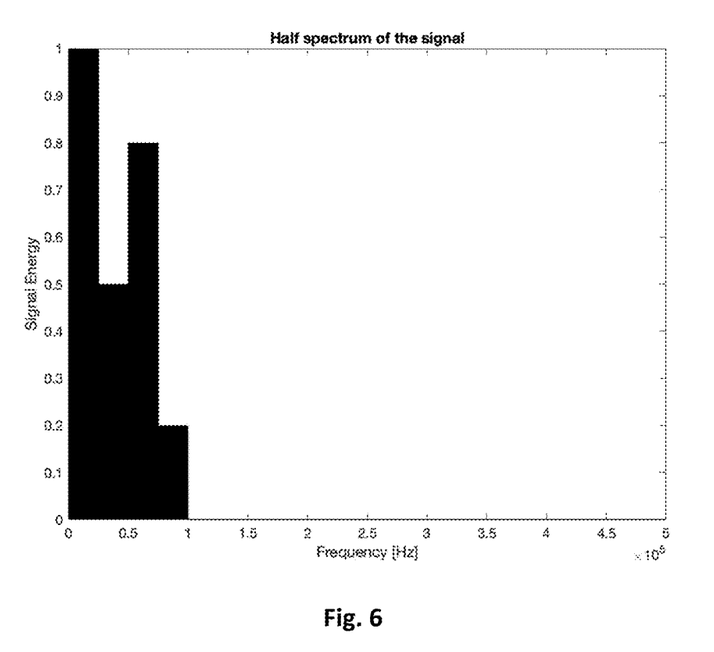
FIG. 6 shows the energy content of another example of a time-varying test stimulus signal that can be used to generate a time-varying test current.
Figure 7:
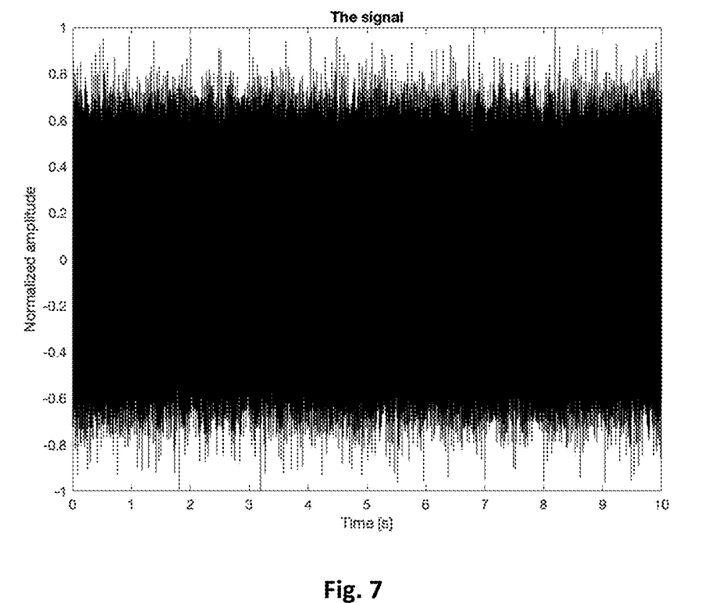
FIG. 7 shows the signal corresponding to FIG. 6.
Figure 8:
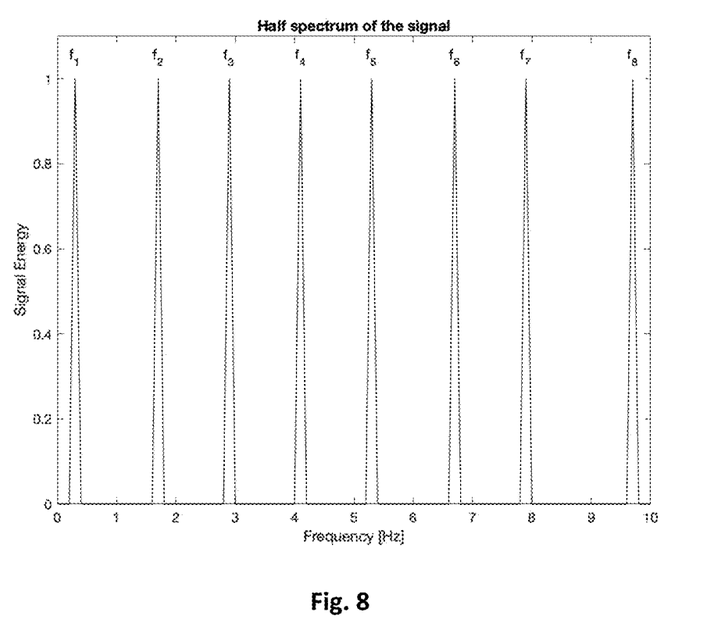
FIG. 8 shows a magnification of a part of FIG. 6, the frequency range up to 10 Hz, so as to show which discrete frequencies actually is used in this exemplified signal.
Figure 9:
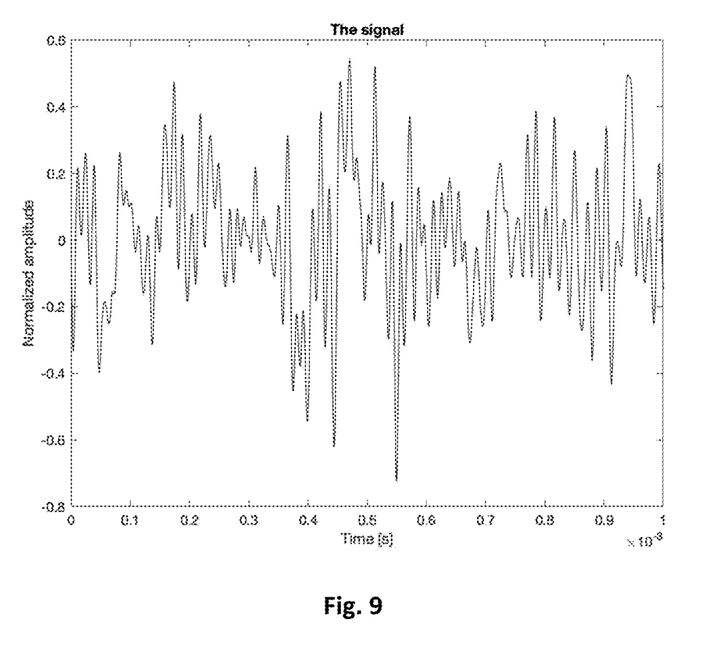
FIG. 9 shows a magnification of the first millisecond of the signal shown in FIG. 7.

FIGS. 6-9 show another example of a time test stimulus signal $I_{in}$ that can be used to generate the time-varying test current, where: FIG. 6 shows the relative signal energy content in different frequency ranges; FIG. 7 shows the signal amplitude as a function of time; FIG. 8 shows a magnification of a part of FIG. 6, i.e. the frequency range up to 10 Hz, so as to show which discrete frequencies actually are used in this range in the exemplified signal; and FIG. 9 shows a magnification of the first millisecond of the signal shown in FIG. 7.

In this example a sampling frequency $f_s$ is 1 Mhz and a total time of measurement is 10 seconds (i.e. the total time period during which the time-varying test current $I_{test}$ is provided through the measurement circuit 30, 31). This sets a theoretical frequency range to be between the fundamental frequency 0.1 Hz ($=f_L=1/T$) and the Nyquist frequency 500 kHz ($f_s/2$). However, it is here selected a frequency range of 0.3 Hz to 100 kHz for the stimulus signal (and thus also for the test current).

FIG. 6 shows that different amplitude/signal energy has been selected for different frequency sub-ranges; the highest amplitude is used for frequencies up to 25 kHz and the lowest amplitude for 75-100 kHz.

FIG. 7 shows the signal amplitude as a function of time during the measurement time T of 10 seconds. In this example the signal comprises 50611 discrete frequencies superimposed onto each other, which makes it difficult to see the details in the signal. Together with FIG. 9, that shows the first millisecond of the signal of FIG. 7, it can be seen that the signal is a complex continuous non-pulsed signal, that it does not look like a regular variant of a sine-curve, and that it has a nontrivial shape that is difficult to predict by just looking at the signal.

FIG. 8 shows the nine first discrete frequencies f1-f9 that actually are used in the frequency range up to 10 Hz: f1=0.3 Hz, f2=1.3 Hz, f3=2.3 Hz, f4=3.7 Hz, f5=4.7 Hz, f6=5.9 Hz, f7=7.1 Hz, f8=8.3 Hz, f9=9.7 Hz. In total there are 50611 discrete frequencies in the whole range 0.3 Hz to 100 kHz. The lowest frequency f1, 0.3 Hz is related to the total time T (and to the fundamental frequency $f_L$) such that f1=N*1/T where N=3. As can be seen in FIG. 8 there is some spread spectrum effect, the frequencies have the width 2*$f_L$ at the base. In this example the frequencies are separated using a minimum frequency separation $f_{d,min}$ of 10*$f_L$. To avoid interference from overtones of lower frequencies the sequence of frequencies starting with f1=k*$f_L$ are selected so that k is prime number separated by 10 units or more (k=3, 13, 23, 37, 47, etc). FIG. 8 also shows that the signal energy is zero between the frequencies f1, f2, etc., i.e. over the frequency separation range $f_d$.

Figure 10:
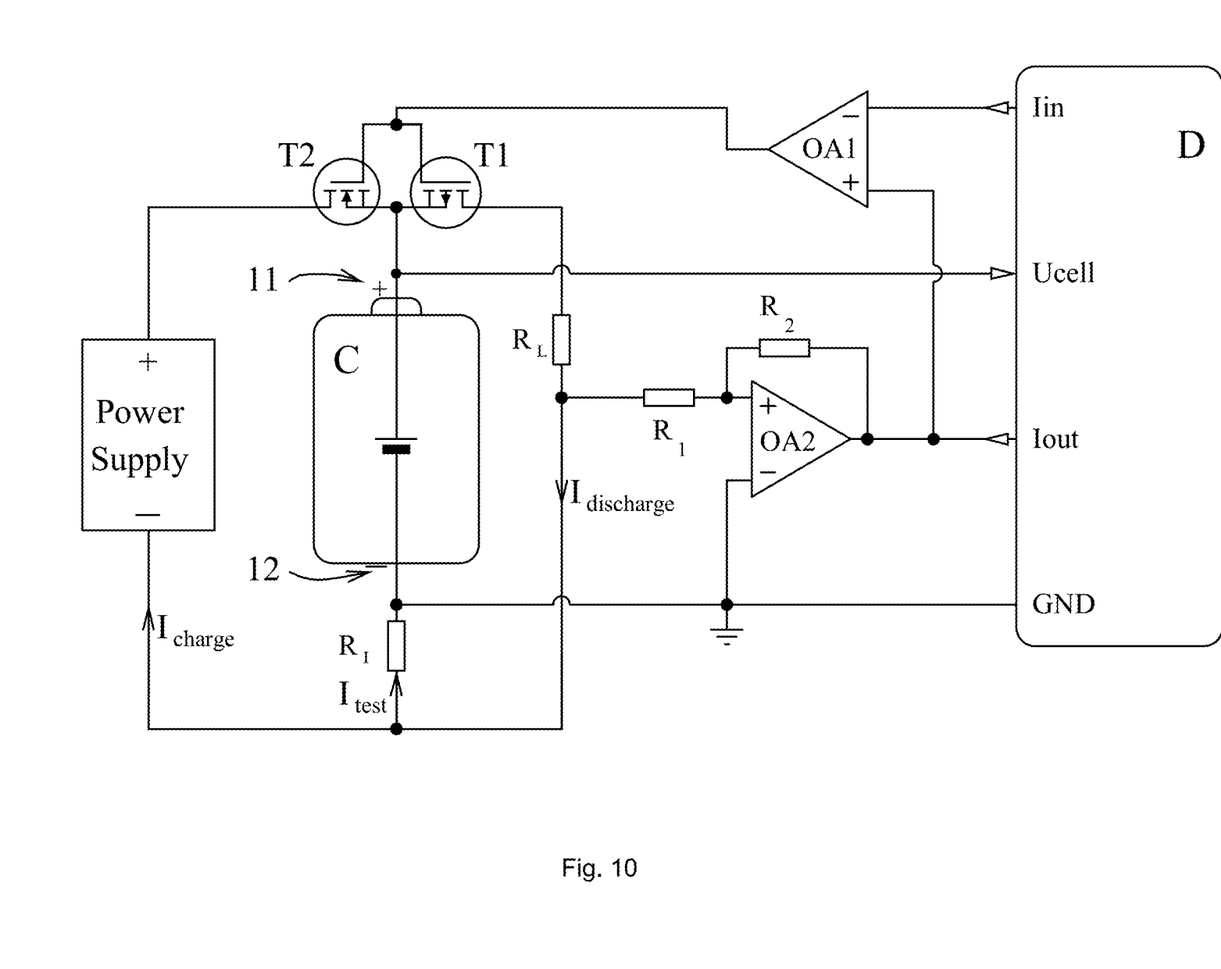
FIG. 10 shows, in a schematic view, a third embodiment of an impedance measuring arrangement suitable for a measuring device for use in e.g. the production lines shown in FIG. 1.

FIG. 10 shows an impedance measuring arrangement according to a third embodiment. The basic structure and function of the circuit in FIG. 10 is the same as of the one in FIG. 3, and the components can have the same properties. The PNP-NPN MOSFET pair allows current to be passed into the electric device C using T2 and current to be taken out of the electric device C using T1. The PNP-NPN construction makes them mutually exclusive so T1 and T2 are not conducting at the same time, causing short circuit. While the circuits in FIGS. 2 and 3 only allow for taking current out of the electric device, the circuit in FIG. 10 allows a test signal that uses a symmetric current that also pushes current into the electric device. It relies on the same type of feedback mechanism with OA1 to control the current to achieve a high precision following of the current. There is a subtle difference, compared to FIG. 3, in that the NPN transistor in FIG. 3 is replaced with a PNP transistor which inverts the logic so that the OA1 also needs to be reversed.

The invention is not limited by the embodiments described above but can be modified in various ways within the scope of the claims. For instance, the measuring device 5, 6 need not necessarily be integrated into an assembly robot or other production line apparatus, and need not necessarily be used in a production line. Further, the test current, or at least the first component thereof, may be supplied from an external power source instead of being drawn from the battery cell subject to measurement. Moreover, although a main application is to carry out measurements on battery cells, such as Li-ion cells, the measuring device may be used to analyse e.g. fuel cells or other relevant electric devices.

The invention claimed is:

1. Measuring device configured to be connected to first and second terminals of an electric device, such as a battery cell, and to determine at least one electrical property of the electric device,
characterized in
that the measuring device comprises an impedance measuring arrangement configured to, when the electric device is connected to the first and second terminals, connect the electric device to a measurement circuit, wherein the impedance measuring arrangement is further configured to:
provide a time-varying test current ($I_{test}$) through the measurement circuit;
measure a voltage ($U_{cell}$) over the electric device while the time-varying test current ($I_{test}$) is provided; and
determine a phase shift and a magnitude ratio between the measured voltage ($U_{cell}$) and the time-varying test current ($I_{test}$) in the measurement circuit,
wherein the time-varying test current ($I_{test}$) comprises a plurality of superimposed discrete frequencies, wherein said discrete frequencies are distributed over a frequency range and separated from each other so as to avoid frequency overlap due to spread spectrum between adjacent frequencies and
wherein adjacent frequencies are separated by a minimum frequency separation, $f_{d,min}$, wherein $f_{d,min} \geq 4*f_L = 4/T$, wherein $f_L = 1/T$ and wherein T is the total time during which the time-varying test current ($I_{test}$) is provided.

2. Measuring device according to claim 1, wherein the impedance measuring arrangement is configured to calculate an internal impedance of the electric device based on the determined phase shift and magnitude ratio.

3. Measuring device according to claim 1, wherein the impedance measuring arrangement is configured to measure the test current ($I_{test}$) in the measurement circuit.

4. Measuring device according to claim 1, wherein the time-varying test current ($I_{test}$) provided through the measurement circuit comprises at least a first component forming a direct current component that centres the current through the measurement circuit at a certain current magnitude and a second component that is a time-varying test stimulus signal ($I_{in}$) and that generates the time-variation of the time-varying test current ($I_{test}$) when combined with the first component.

5. Measuring device according to claim 4, wherein the first component of the time-varying test current ($I_{test}$) is drawn from the electric device.

6. Measuring device according to claim 4, wherein the impedance measuring arrangement comprises current stimulus circuitry (OA1, T) configured to generate the time-varying test stimulus signal ($I_{in}$).

7. Measuring device according to claim 6, wherein the impedance measuring arrangement comprises a data acquisition system (D) connected to the current stimulus circuitry (OA1, T), the current sensing circuitry ($R_{L+I}$, $R_I$, OA2) and the voltage sensing circuitry, wherein the data acquisition system (D) comprises a computation circuitry configured to calculate, based on the test current ($I_{test}$) and the voltage ($U_{cell}$), an internal impedance of the electric device.

8. Measuring device according to claim 4, wherein the impedance measuring arrangement comprises a transistor (T) configured to effectuate the time-varying test stimulus signal ($I_{in}$) so that it realize the time-varying test current ($I_{test}$).

9. Measuring device according to claim 8, wherein the impedance measuring arrangement comprises a feedback loop configured to: measure the signal ($I_{out}$) representing the test current ($I_{test}$) in the measurement circuit; compare this signal ($I_{out}$) with the time-varying test stimulus signal ($I_{in}$); and adjust an input voltage to the transistor (T) so as to improve agreement between the two signals ($I_{out}$, $I_{in}$) in the measurement circuit.

10. Measuring device according to claim 1, wherein the impedance measuring arrangement comprises current sensing circuitry ($R_{L+I}$, $R_I$, OA2) configured to generate a signal ($I_{out}$) representing the test current ($I_{test}$) in the measurement circuit.

11. Measuring device according to claim 1, wherein the impedance measuring arrangement comprises voltage sensing circuitry (D) configured to measure a voltage ($U_{cell}$) between the first and second terminals.

12. Measuring device according to claim 1, wherein the time-varying test current ($I_{test}$) contains at least one discrete frequency within the interval 10 mHz to 100 KHz.

13. Measuring device according to claim 12, wherein the time-varying test current ($I_{test}$) contains a plurality of superimposed discrete frequencies within the interval 10 mHz to 100 KHz.

14. Measuring device according to claim 1, wherein said plurality of superimposed discrete frequencies comprises at least 10 discrete frequencies.

15. Measuring device according to claim 1, wherein a total time T for providing the time-varying test current is 100 s or less.

16. Measuring device according to claim 1, wherein a signal energy between a discrete frequency and an upper or lower adjacent discrete frequency is <10%, preferably <1%, or more preferably <0.1% of the signal energy of one of said two adjacent discrete frequencies.

17. Measuring device according to claim 1, wherein a signal energy between a discrete frequency and an upper or lower adjacent discrete frequency is zero or close to zero.

18. Measuring device according to claim 1, wherein the measuring device is integrated into a production or assembly line machine/robot.

19. Measuring device according to claim 1, wherein the first and second terminals form a positive pole and a negative pole, respectively, of a battery cell.

20. Measuring device according to claim 1 wherein $f_{d,min} \geq 8 \cdot f_L = 8/T$.

21. Measuring device according to claim 1 wherein $f_{d,min} \geq 10 \cdot f_L = 10/T$.

22. Measuring device according to claim 1, wherein said plurality of superimposed discrete frequencies comprises at least 100 discrete frequencies.

23. Measuring device configured to be connected to first and second terminals of an electric device, such as a battery cell, and to determine at least one electrical property of the electric device, characterized in that the measuring device comprises an impedance measuring arrangement configured to, when the electric device is connected to the first and second terminals, connect the electric device to a measurement circuit, wherein the impedance measuring arrangement is further configured to:

provide a time-varying test current ($I_{test}$) through the measurement circuit;

measure a voltage ($U_{cell}$) over the electric device while the time-varying test current ($I_{test}$) is provided; and determine a phase shift and a magnitude ratio between the measured voltage ($U_{cell}$) and the time-varying test current ($I_{test}$) in the measurement circuit, wherein the time-varying test current ($I_{test}$) comprises a plurality of superimposed discrete frequencies, wherein said discrete frequencies are distributed over a frequency range and separated from each other so as to avoid frequency overlap due to spread spectrum between adjacent frequencies and wherein the plurality of superimposed discrete frequencies form a frequency sequence comprising a lowest frequency, f1, and at least one higher frequency, f2, f3 ... $f_h$, wherein any one of the higher frequencies f2-$f_h$ in said frequency sequence divided by frequency f1 does not yield an integer.

24. Measuring device according to claim 23, wherein f1 is related to a total time T of providing the time-varying test current such that f1=N*1/T where N>2.

25. Measuring device according to claim 24, wherein N is a prime number.

* * * * *